United States Patent [19]

Ocken

[11] Patent Number: 4,809,057

[45] Date of Patent: Feb. 28, 1989

[54] ELECTRICAL COMPONENT ASSEMBLY AND METHOD OF MANUFACTURE THEREOF

[75] Inventor: Alfred G. Ocken, Franklin Park, Ill.

[73] Assignee: Motorola, Inc., Schaumburg, Ill.

[21] Appl. No.: 943,529

[22] Filed: Dec. 18, 1986

[51] Int. Cl.$^4$ .......................................... H01L 23/32
[52] U.S. Cl. ...................................... 357/76; 357/72; 357/75
[58] Field of Search .................... 357/76, 77, 75, 72

[56] References Cited

FOREIGN PATENT DOCUMENTS 7812996 11/1979 France .
7812994 1/1980 France .

*Primary Examiner*—Robert S. Macon
*Attorney, Agent, or Firm*—Phillip H. Melamed

[57] ABSTRACT

An electrical component assembly (10), comprising a rectifier bridge, utilizes a protective cover (30) for mechanical protection of semiconductor diode dies (11, 12) mounted on an aluminum heat sink support carrier (16). Channels (37, 37B) with effective openings (40, 40A) therein are provided in a top surface (38) of the protective cover to facilitate applying an environmental sealing materail (45) through said channels and openings to the semiconductor diode dies of the electrical assembly as well as to various critical electrical interconnections (48) in the electrical assembly. By utilizing the mechanically protective cover to also provide for guiding the application of an environmental sealing material for the electrical assembly, extensive fixturing in providing a desired electrical assembly is minimized, the assembly is rendered more readily manufacturable, and protection of the assembly is provided even during the step of dispensing the sealing material.

20 Claims, 2 Drawing Sheets

ELECTRICAL COMPONENT ASSEMBLY AND METHOD OF MANUFACTURE THEREOF

BACKGROUND OF THE INVENTION

The present invention is related to electrical component assemblies and their method of manufacture. More specifically, the present invention is related to providing mechanical protection for electrical components in an assembly while also readily providing for sealing at least some of these components and/or electrical interconnections to these components from the environment.

In prior electrical component assemblies, it is known to provide a rigid cover over the components to provide mechanical protection. In some instances, this cover may be termed a housing instead of a component cover, but in each case the function is to provide mechanical protection for the components. Some of these prior covers have holes in them to provide air ventilation for the protected components. In component assemblies such as these it may also be necessary to provide an environmental seal over certain of these electrical components and/or critical electrical interconnection points to these components. Typically a silicone rubber or epoxy is utilized as an environmental sealing material which is deposited over each of the areas to be sealed, and then the protective mechanical cover is applied over the electrical component assembly. While clearly this is a feasible technique, generally elaborate fixturing and guide mechanisms are utilized to dispense and guide the environmental sealing material to the appropriate locations on the electrical assembly. The present invention deals with an improved electrical component assembly and method of manufacture which minimizes the extensive guiding mechanisms previously utilized to apply the environmental sealing material in the appropriate locations on the assembly.

SUMMARY OF THE INVENTION

An object of the present invention is to provide both an improved electrical component assembly and an improved method of manufacturing such an electrical assembly wherein environmental sealing material is applied over certain desired areas of the electrical assembly without the use of complex additional fixtures or dispensing tools to insure the application of the sealing material to the proper location.

In one embodiment of the present invention, an electrical component assembly is provided. The electrical component assembly comprises: a plurality of electrical components and electrical interconnections therebetween mounted to a support carrier; a protective cover mounted to said carrier and effectively positioned at least partially about said components and electrical interconnections to provide mechanical protection to at least some of said components; said cover having fluid flow channels therein and at least one effective opening in each of said channels, each of said openings being adjacent and associated with at least one of said components and said electrical interconnections; and an environmental sealing material provided, in an initial fluid state, over at least one of said components and said electrical interconnections via said cover channels and said openings therein, whereby said channels and openings in said protective cover operate as guide mechanisms for applying said sealing material.

Essentially, the present invention involves providing an electrical component assembly in which the mechanical protective cover has channels and openings therein which assist in applying an environment sealing material to the electrical components mechanically protected by the cover. The present invention involves providing such an assembly and the method of manufacturing such an assembly. Advantageously, some of these channels may have two or more openings therein positioned adjacent to separate associated electrical components and/or electrical interconnections, and the channel has a single inlet portion separate from the openings in the channel which openings are adjacent to associated components and interconnections. In this manner, the environmental sealing material is applied to the inlet portion of the channel and flows through the channel to a plurality of components and/or electrical interconnections which require the application of the environmental sealing material. After the sealing material is applied in its initial fluid state, it is then cured so as to obtain at least a gel-type consistency to provide the desired environmental sealing. Preferably, split tubular side walls extend from the openings in the cover toward the components and electrical interconnections to be sealed so as to further control the dispensing of the environmental sealing material.

The above-described operation of the present invention, as well as additional aspects, will now be discussed in detail.

BRIEF DESCRIPTION OF THE DRAWINGS

For a more complete understanding of the present invention, reference should be made to the drawings in which.

DESCRIPTION OF THE PREFERRED EMBODIMENTS OF THE INVENTION

Figure 1:
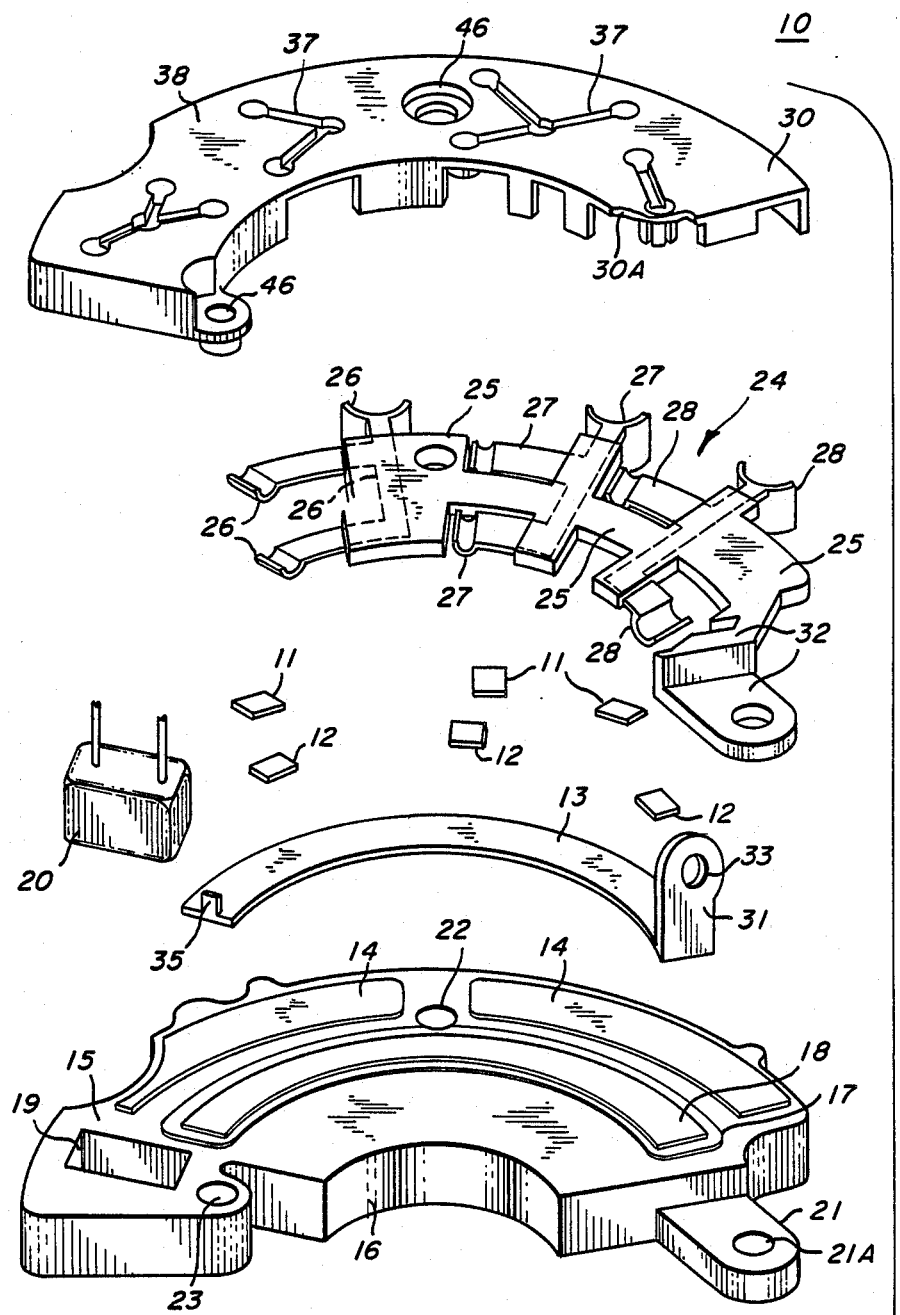
FIG. 1 comprises an exploded perspective view of an electrical component assembly constructed in accordance the present invention.

Referring to FIG. 1, an electrical component assembly 10 is illustrated in exploded assembly form. The assembly comprises an alternator diode rectifier bridge assembly and includes a plurality of electrical components comprising semiconductor diode dies 11 and 12. The diode dies 12 comprise three diode dies having their anodes soldered to a conductive copper heat spreader plate 13, and these dies correspond to the positive rectifying diodes in an alternator rectifier bridge assembly. The semiconductor diode dies 11 comprise diode dies having their cathodes soldered to a flame-sprayed copper metallization 14 applied to a top substantially planar surface 15 of an aluminum heat sink 16 which serves as a support carrier for the semiconductor diode dies. A ceramic insulating layer 17, preferably comprising alumina ($Al_2O_3$), is also flame-sprayed on the top surface 15 of the aluminum heat sink. On top of this insulating layer 17, a flame-sprayed copper metallization layer 18 is provided. The heat sink 16 also has a through cavity 19 in which the body of a capacitor 20 will be provided so as to provide a substantially planar configuration for the assembled electrical component assembly 10. The aluminum heat sink 16 also has an extending integral aluminum tab 21 with a through hole 21A therein, and two mounting holes 22 and 23 are also provided in the aluminum heat sink such that the heat sink can be mounted to an additional chassis such as the housing of an alternator.

The electrical component assembly 10 is provided with a molded lead frame 24 comprising molded insulating portions 25. Imbedded in the insulating portions 25 are at least portions of three sets of electrical interconnection leads 26, 27 and 28, each set being electrically isolated from the other. Each set of interconnection leads has three lead extensions extending from the insulation portions 25. Two of the three lead extensions in each of the sets of electrical interconnection leads have an end U-shaped portion with the valley of the U-shaped portion intended for making electrical solder contact to a top surface of an associated one of the semiconductor diode dies 11 and 12. In addition, he electrical component assembly 10 includes a rigid molded plastic insulating protective cover 30 mounted to the aluminum heat sink 16 and effectively positioned at least partially about the semiconductor diode dies and various electrical interconnections provided adjacent to the top surface of the aluminum heat sink so as to provide mechanical protection for the diode dies and critical electrical interconnections area on the heat sink. Prior to discussing additional characteristics of the protective cover 30, the assembly of the aforementioned components will now be discussed.

Initially, the aluminum heat sink 16 is provided with the flame-sprayed insulating layer 17. Then the copper conductive metallization layers 14 and 18 are applied. These copper metallization layers provide a solderable surface to which the semiconductor dies can be electrically connected via a solder connection. In addition, it should be noted that the copper metallization layer 18 is electrically isolated by the flame-sprayed ceramic layer 17 so that diodes soldered to the metallization 18 will be electrically isolated from the heat sink. This is required since for an alternator diode rectifier bridge assembly, typically the negative diode dies 11 will have their cathodes directly connected to the aluminum heat sink, which represents a ground connection, while anodes of the diodes 12 representing the positive semiconductor diode dies will have their anodes electrically connected to the metallization 18, but electrically isolated from the ground potential of the aluminum heat sink.

The copper heat spreader plate 13 is provided with the positive diode dies 12 which are soldered to this plate. Then, preferably solder paste is applied to the flame-sprayed copper metallizations 14 and 18 and the copper plate 13 is mounted to the copper metallization 18 and the negative diode dies 11 are mounted to the copper metallization 14. After this, additional solder paste is applied to the exposed top surfaces of the diode dies 11 and 12, and then the molded lead frame 24 is assembled with the U-shaped portions of the electrical interconnection leads, which are preferably copper, in contact with an associated top surface of a semiconductor diode die. After the preceding assembly, the entire subassembly created so far is reflow-soldered. Then, a vertically extending ear portion 31 of the heat spreader plate 13 is bent downward over a portion 32 of the insulating portion 25 of the molded lead frame wherein a through hole 33 in the ear portion 31 will then correspond to the through hole 21A in the extending ear 21 of the heat sink. This creates an insulated electrical extension of the heat spreader plate 13 so as to provide external electrical access to the anodes of the positive diode dies 12. This access can be provided by an electrically conductive bolt having a head in contact with the ear portion 31 but passing through and electrically isolated from the heat sink 16. Either before or after the preceding bending operation, the capacitor 20 has a lead soldered to the metallization 14 and a lead soldered to an upstanding end portion 35 of the heat spreader plate 13. The body of the capacitor 20 is positioned in the cavity 19.

Figure 2:
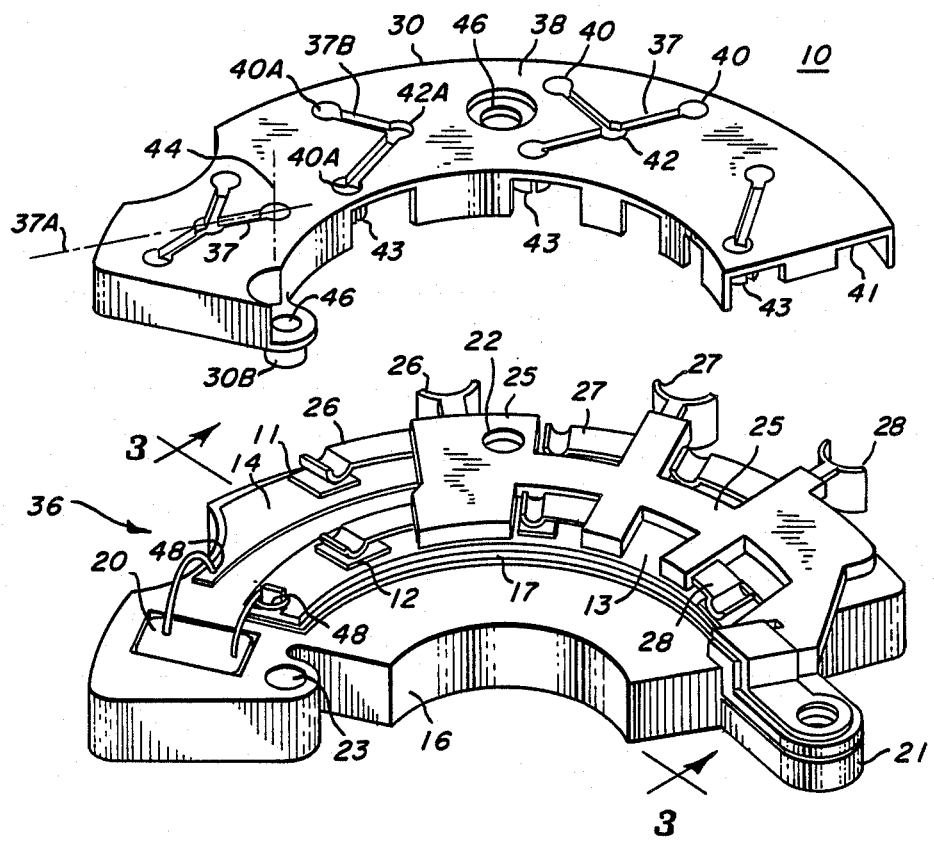
FIG. 2 comprises an exploded perspective view of the assembly shown in FIG. 1 after partial assembly.

Following the assembly steps discussed in the preceding paragraph, an alternator diode rectifier bridge subassembly 36 is provided wherein this subassembly is illustrated, in assembled form, in FIG. 2. Subsequently, the protective cover 30 is affixed to this assembly and an environmental sealing fluid is advantageously applied through the cover 30 to environmentally seal each of the semiconductor diode dies 11 and 12, as well as critical electrical interconnections. This is accomplished through the use of channels 37 formed in a top surface 38 of the cover 30. Each of the channels 37 includes at least one effective opening 40 therein which is essentially provided on a bottom surface 41 of the cover which faces the semiconductor diode dies 11 and 12. Each of the channels 37 also includes an inlet portion 42 which is preferably separate from any of the openings 40 in any of the channels 37.

It should be noted that there are effective tubular extensions 43, which comprise effective cylindrical extensions having split side walls, which effectively extend from each of the openings 40 on the bottom surface 38 toward either the electrical component or the electrical interconnection to which an environmental sealing material is to be applied. Preferably, the cylindrical extensions 43 and the openings 40 have a coincident central longitudinal through axis 44 which is substantially perpendicular to a primary longitudinal axis, such as 37A, of the channels 37 in which the openings 40 are provided. The side walls of the extensions 43 have four vertical slots therein spaced 90 degrees apart about the central axis 44, as is shown best in FIG. 1 adjacent a corner 30A of the cover 30 which is shown partially removed, to provide effective split cylindrical side wall extensions. In addition, the present invention advantageously contemplates at least one of the channels 37, such as a channel 37B, having at least two openings 40A therein which are separate from the associated inlet portion 42A and connected thereto by equal length, as measured from inlet portion 42A, longitudinal runner channels which comprise the channel 37B. Each of the openings 40A is positioned adjacent to a separate associated one of the semiconductor dies or electrical interconnections which are to be environmentally sealed.

It should be noted the channels 37 could comprise just a cylindrical or funnel-shaped opening in the top surface 38 of the cover 30 directly connecting to the opening 40 in the bottom surface 38 through a cylindrical path in the cover. However, preferably the channels 37 comprise laterally extending grooves in the top surface 38. Also note that the cylindrical extensions 43 have the split side wall configuration so as to encourage a controlled initial flow out of a sealing material to be deposited through these extensions.

Essentially, the present invention involves utilization of the cover 30 as described above to assist in applying an environmental sealing material 45, which will initially be applied in a liquid state, to provide an environmental seal over the semiconductor diode dies 11 and 12 and various other electrical interconnections between components. This is accomplished in the following manner.

Figure 3:
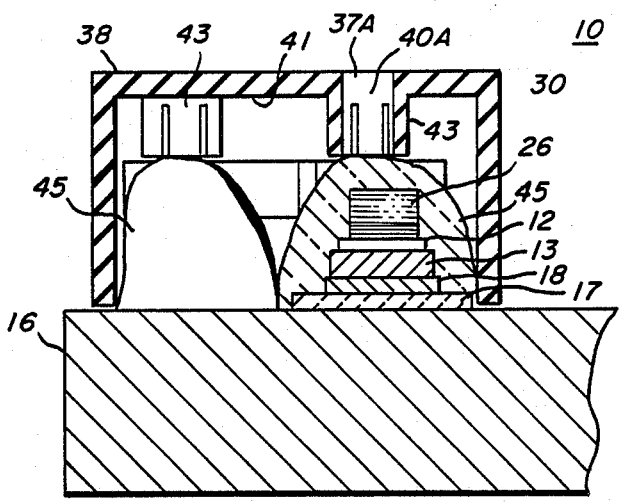
FIG. 3 comprises a cross-sectional view of a portion of the assembly shown in FIG. 2 after final assembly and the application of an environmental sealing material.

As indicated in FIG. 2, the protective cover 30 is intended for assembly to the subassembly 36 such that the cover is mounted to the aluminum heat sink 16. The cover 30 has at least one projection 30B which mates with the opening 23 in the heat sink 16 to provide proper alignment of these parts. After this assembly, a mass of the environmental sealing material is provided, in an initial fluid state, at the inlet portions 42 of the channels 37 while the electrical component assembly 10 is preferably in a horizontal orientation as shown in FIG. 3. This results in the environmental sealing fluid flowing through the channels 37, the openings 40 and the tubular extensions 43 so as to provide the environmental sealing fluid over the semiconductor diode die and electrical interconnections. Subsequently, the entire electrical component assembly 10 is subjected to a sealing material cure cycle such that the environmental sealing material now retains at least a gel consistency as opposed to a fluid consistency. It is contemplated that the environmental sealing material 45 always has at least a relatively thick viscosity to insure adequate coverage of the semiconductor diode dies and electrical interconnections to be sealed by preventing excessive flow of the sealing material.

Essentially, the present invention utilizes the channels and openings in the cover 30 to assist in the application of the environmental sealing material 45. This eliminates the need for separate production fixtures to apply the sealing material to a large number of various locations on the electrical component assembly 10. Also, the sealing material is applied after the cover 30 provides mechanical protection for the diodes, and external dispensing tools for the sealing material do not have to be positioned directly adjacent the diode dies. These features eliminate the possibility of the external dispensing tools contacting and damaging the dies, while precise controlled application of the sealing material is provided by the channel and tubular extension guide structures provided in the cover 30. It should be noted that preferably, the longitudinal lengths of the runners of the channel 37A should be substantially equal, from inlet 42A, if an equal deposit of environmental sealing material is required on the components and interconnections associated with the openings 40A. In addition, the cover 30 has through openings 46 such that retaining bolts can pass through these through openings, and through the corresponding through openings 22 and 23 in the heat sink 16, so as to mount the electrical component assembly 10 to an alternator housing or other appropriate housing. The cover 30 will remain fixed to the heat sink 16 after application of the sealing material. Thus the guide structure for applying the sealing material remains part of the assembly 10 and performs the function of providing mechanical protection for components.

FIG. 3 illustrates in cross-section the structure resulting from utilization of the present invention and illustrates, therefore, the application of the environmental sealing material 45 via the channels 37 and openings 40 to the semiconductor diode dies. It should be noted that in addition to environmentally sealing the semiconductor dies 11 and 12, the present invention also contemplates providing environmental sealing material 45 over critical electrical connections in the electrical component assembly 10, such as the solder connections 48 between the leads of the capacitor 20, and the metallization 14 and heat spreader plate 13.

Preferably, the environmental sealing material can comprise a silicone rubber, a Silastic material or epoxy, or any other type of suitable environmental sealing material which has an initial flow characteristic and can undergo a subsequent cure operation so as to increase its viscosity and impede subsequent flow characteristics. This is desirable so that after the cure cycle, which can be a high temperature oven cure, the environmental sealing material will stay where it has been positioned by the channels and openings in the cover 30, which cover, in addition to providing this guiding function for the sealing material, also provides mechanical protection for the components in the electrical component assembly 10.

While specific embodiments of the present invention have been shown and described, further modifications and improvements will occur to those skilled in the art. All such modifications which retain the basic underlying principles disclosed and claimed herein are within the scope of this invention.

I claim:

1. An electrical component assembly comprising:
   a plurality of electrical components and electrical interconnections mounted on a support carrier; a protective cover mounted to said support carrier and effectively positioned at least partially about said components and electrical interconnections to provide mechanical protection to at least some of said components;
   said cover having fluid flow channels therein and at least one effective opening in each of said channels, each of said openings being adjacent to and associated with at least one of said components and electrical interconnections;
   and an environmental sealing material provided, in an initial fluid state, over said at least one of said components and electrical interconnections via said cover channels and said openings, whereby said channels and openings in said protective cover operate as guide mechanisms for applying said sealing material.

2. An electrical component assembly according to claim 1 wherein at least one of said channels has at least two of said openings therein, each of said two openings being positioned adjacent to a separate associated one of at least one of said components and interconnections.

3. An electrical component assembly according to claim 2 wherein said one channel has an inlet portion separate from said two openings.

4. An electrical component assembly according to claim 3 wherein said inlet portion is effectively equally positioned from said two openings.

5. An electrical component assembly according to claim 1 wherein said channels are formed in a top surface of said protective cover, said cover having a bottom surface facing said components, and wherein each of said openings in said channels is provided at least on said bottom surface and extends through said cover to the channel said opening is provided therein.

6. An electrical component assembly according to claim 5 wherein said cover includes an effective tubular extension thereof extending from said opening on said bottom surface toward said at least one of said components and interconnections associated with said opening.

7. An electrical component assembly according to claim 6 wherein said channels have a longitudinal axis, and wherein said tubular extension has a central longitudinal axis which is substantially perpendicular to the longitudinal axis of the channel having the opening therein from which said tubular extension extends.

8. An electrical component assembly according to claim 7 wherein said extension essentially comprises a cylindrical extension having split side walls.

9. An electrical component assembly according to claim 8 wherein said opening has a central through axis which is substantially coincident with the central longitudinal axis of the extension and substantially perpendicular to the longitudinal axis of said channel.

10. An electrical component assembly according to claim 1 wherein said cover comprises a molded plastic part.

11. A method for providing an electrical component assembly, comprising the steps of:
    mounting a plurality of electrical components and electrical interconnections on a support carrier;
    then mounting a protective cover to said support carrier while effectively positioning said cover at least partially about said components to provide mechanical protection to said components, said cover having fluid flow channels therein and openings in said channels, each of said openings being adjacent to and associated with at least one of said components and electrical interconnections; and
    then providing an environmental sealing material over said at least one of said components and electrical interconnections by applying the sealing material, in an initial fluid flow state, to said channels and having said material flow onto said at least one of said components and electrical interconnections via said cover channels and said openings, whereby said channels and openings operate as guide mechanisms for applying the sealing material.

12. A method for providing an electrical component assembly according to claim 11 wherein at least one of said channels has at least two of said openings therein, each of said two openings being positioned adjacent to a separate associated one of at least one of said components and interconnections.

13. A method for providing an electrical component assembly according to claim 12 wherein one said channel has an inlet portion separate from said two openings, and wherein said step of applying said sealing material comprises a step of applying a mass of said sealing material to said inlet portion and relying on flowing of said material in said one channel to apply said material through said two openings to said components and electrical interconnections associated with and adjacent said openings.

14. A method for providing an electrical component assembly according to claim 13 wherein said inlet portion is effectively equally positioned from said two openings, and wherein said step of applying said sealing material results in providing a substantially equal amount of said sealing material through each of said two openings.

15. A method for providing an electrical component assembly according to claim 11 wherein said channels are formed in a top surface of said protective cover, said cover having a bottom surface facing said components, and wherein each of said openings in said channels is provided at least on said bottom surface and extends through said cover to the channel said opening is provided therein, and wherein said cover includes an effective tubular extension thereof extending from said opening on said bottom surface toward said at least one of said components and interconnections associated with said opening.

16. A method for providing an electrical component assembly according to claim 15 wherein said channels have a longitudinal axis, and wherein said tubular extension has a central longitudinal axis which is substantially perpendicular to the longitudinal axis of the channel having the opening therein from which said tubular extension extends.

17. A method for providing an electrical component assembly according to claim 11 which includes the step of curing said applied sealing material after said step of providing said sealing material to said at least one of said components and electrical interconnections.

18. A method for providing an electrical component assembly according to claim 11 wherein one said channel has an inlet portion separate from said opening therein, and wherein said step of providing said sealing material comprises a step of applying a mass of said sealing material to said inlet portion and relying on flowing of said material in said one channel to apply said material through said opening to said at least one of said components and electrical interconnections associated with and adjacent said opening.

19. An alternator rectifier bridge assembly comprising:
    a plurality of semiconductor diode die and electrical interconnections mounted on a support carrier comprising a metal heat sink plate;
    a protective cover mounted to said support carrier and effectively positioned at least partially about said diode die and electrical interconnections to provide mechanical protection to said diode die;
    said cover having fluid flow channels therein and at least one effective opening in each of said channels, each of said openings being adjacent to and associated with at least one of said diode die and electrical interconnections; and
    an environmental sealing material provided, in an initial fluid state, over said at least one of said diode die and electrical interconnections via said cover channels and said openings, whereby said channels and openings in said protective cover operate as guide mechanisms for applying said sealing material.

20. An alternator rectifier bridge assembly according to claim 19 wherein said channels are formed in a top surface of said protective cover, said cover having a bottom surface facing said components, and wherein each of said openings in said channels is provided at least on said bottom surface and extends through said cover to the channel said opening is provided therein, wherein said cover includes an effective tubular extension thereof extending from said opening on said bottom surface toward said at least one of said diode die and interconnections associated with said opening, and wherein said channels have a longitudinal axis, and wherein said tubular extension has a central longitudinal axis which is substantially perpendicular to the longitudinal axis of the channel having the opening therein from which said tubular extension extends.

* * * * *